United States Patent
Wachter

[11] Patent Number: 6,064,240
[45] Date of Patent: May 16, 2000

[54] COMPARATOR CIRCUIT WITH LOW CURRENT CONSUMPTION

[75] Inventor: Franz Wachter, Villach, Austria

[73] Assignee: Siemens Aktiengesellschaft, Munich, Germany

[21] Appl. No.: 09/033,138

[22] Filed: Mar. 2, 1998

[30] Foreign Application Priority Data

Feb. 28, 1997 [DE] Germany .......................... 197 08 203

[51] Int. Cl.$^7$ .................................................. H03K 5/22
[52] U.S. Cl. ............................. 327/66; 327/70; 327/103; 327/563; 330/261
[58] Field of Search ................................. 327/52, 53, 63, 327/66, 103, 108, 560, 563, 69, 70, 65; 330/261

[56] References Cited

U.S. PATENT DOCUMENTS

| | | | |
|---|---|---|---|
| 4,338,527 | 7/1982 | Nagano | 327/103 |
| 4,362,956 | 12/1982 | Ogasawara et al. | 327/354 |
| 4,529,891 | 7/1985 | Oida | 327/77 |
| 4,766,394 | 8/1988 | Yukawa | 330/255 |
| 4,837,523 | 6/1989 | Wright | 330/267 |
| 5,049,761 | 9/1991 | Zitta | 327/65 |
| 5,311,145 | 5/1994 | Huijsing et al. | 330/261 |
| 5,515,005 | 5/1996 | Yoshioka | 330/255 |
| 5,774,021 | 6/1998 | Szepesi et al. | 330/257 |

FOREIGN PATENT DOCUMENTS

| | | | |
|---|---|---|---|
| 0442001B1 | 8/1991 | European Pat. Off. | H03K 5/24 |
| 4-156107 | 5/1992 | Japan | H03K 5/08 |

*Primary Examiner*—Timothy P. Callahan
*Assistant Examiner*—Terry L. Englund
*Attorney, Agent, or Firm*—Herbert L. Lerner; Laurence A. Greenberg; Werner H. Stemer

[57] ABSTRACT

A comparator circuit with low current consumption for driving a sawtooth generator includes two differential amplifiers connected back to back, which control the bias current of an operational amplifier through a current measuring device and a means for impressing bias current. During normal operation, that is to say outside a switch-over point of the operational amplifier, the means for impressing bias current is supplied by a comparatively small standby current. Near the switch-over point of a sawtooth signal, the bias current of the operational amplifier is increased. Since the bias current source supplies a current pulse only at the switch-over point of the sawtooth signal, but remains switched off for the remainder of the time, the comparator circuit current consumption is minimized.

11 Claims, 3 Drawing Sheets

COMPARATOR CIRCUIT WITH LOW CURRENT CONSUMPTION

BACKGROUND OF THE INVENTION

1. Field of the Invention

The invention relates to a comparator circuit with a differential amplifier. In analog integrated circuits, comparators are often used to compare two voltages to one another. The outcome of the comparison is indicated at the output of the comparator by a certain switching state. A comparator typically includes a differential amplifier, which on the output side triggers a transistor disposed downstream of the comparator. Depending on the input signal, the output of the differential amplifier turns the downstream transistor either on or off. Comparator circuits of this generic type are known, for instance from European Patent 0 442 001 B1 and from U.S. Pat. No. 4,529,891. The European Patent 0 442 001 B1 is discussed in more detail below in regards to FIG. 1.

Comparator circuits are typically used in integrated sawtooth generators. To that end, a circuit is chosen that charges and discharges an external capacitor via a reversible constant current. If the capacitor voltage overshoots or undershoots an internally generated maximum reference voltage, a comparator switches over to a discharging or charging current, as a result of which the external capacitor is discharged or charged, respectively. An integrated sawtooth generator typically has a clock frequency of 100 KHz at a frequency error of ±5% and a typical duty cycle of $t_r/T = 86\%$.

A unique problem associated with such an integrated circuit is the need for a very low frequency error of ±5% at a presumed ideal external capacitance. The accuracy of the sawtooth generator is determined essentially by the voltage and current sources and by the properties of the comparator. The offset voltage of the comparator, given sufficient common-mode suppression, is of equal magnitude at both switching thresholds, and any frequency error that occurs is compensated for. Any deviation in the clock transit time, however, is fully expressed in the resultant frequency error. In this way, "overshooting" of the ideal switching thresholds reduces the clock frequency. The greater the duty cycle, the more strongly the comparator behavior is expressed in a change of frequency.

In general, high switching speeds can be attained with bipolar differential amplifiers. In smart power technology (SMT), however, only very slow bipolar transistors that have poor current amplification properties are available. Yet in smart power technology the input structures must be triggered with as little loss as possible, i.e. with the highest possible impedance. MOS level converters that may be connected upstream of the differential amplifier have proven to be disadvantageous. As a result of parasitic capacitances, MOS level converters have lengthened switching times and increased current consumption due to the high bias current required. To supply the requisite high impedance at the inputs, field-effect-controlled components, such as MOSFETs, IGBTs, etc. are used as input transistors for the differential amplifier.

SUMMARY OF THE INVENTION

It is accordingly an object of the invention to provide an improved comparator circuit which overcomes the above-mentioned disadvantages of the prior art devices and methods of this general type, in which current consumption is considerably reduced and which allows high switching speeds even with the use of shallow voltage edges over time or the use of SMT-type input transistors.

With the foregoing and other objects in view there is provided, in accordance with the invention, a comparator circuit, including: a differential amplifier which receives input signals and has an output; at least one further differential amplifier which also receives the input signals and has an output; a current measuring device for coupling the output of the one differential amplifier and the output of the at least one further differential amplifier and which compares the input signals to one another; a controllable bias current source; and a first amplifier stage activated if the input signals are the same for turning on the controllable bias current source.

In accordance with an added feature of the invention, the input signals include a first input signal and a second input signal; and at least one of the differential amplifiers includes: a supply voltage source with a first pole and a second pole; a first input transistor with a drain terminal, a source terminal and a gate terminal, the gate terminal of the first input transistor receives the first input signal, a second input transistor with a drain terminal, a source terminal and a gate terminal, the gate terminal of the second input transistor receives the second input signal, the drain terminal of the first input transistor and the drain terminal of the second input transistor are connected to the first pole of the supply voltage source, the source terminal of the first input transistor is coupled to the source terminal of the second input transistor; a current mirror circuit connected between the first pole and the drain terminals of the first input transistor and the second input transistor; and a current impression device is connected to the coupled source terminal of the first input transistor and the second input transistor and to the second pole of the supply voltage source.

In accordance with another feature of the invention, the at least one further differential amplifier is interconnected equivalently to the one differential amplifier and is connected inversely parallel to the one differential amplifier.

In accordance with an additional feature of the invention, the current measuring device includes: a third and a fourth current mirror circuit each having an output side; a first and a second switching transistor couples the third current mirror circuit to the at least one further differential amplifier and the fourth current mirror circuit to the one differential amplifier, respectively; a first and a second reference current source, the third and the fourth current mirror circuit are each connected on the output side to the first and the second reference current sources, respectively; and an AND gate circuit, the third and the fourth current mirror circuits are coupled to one another on the output side via the AND gate circuit.

In accordance with yet another added feature of the invention, there is a further comparator triggered by the comparator circuit.

In accordance with yet another feature of the invention, there is a further current impression device for current impression connected to the AND gate circuit, the further current impression device forms a second amplifier stage.

In accordance with yet another additional feature of the invention, the first input transistor and the second input transistor are field-effect-controlled transistors.

In accordance with a further added feature of the invention, the controllable bias current source is a controllable semiconductor element. Such a component may for instance be a power MOSFET, which is controlled via its gate and via whose drain-to-source load path the bias current is supplied to the downstream comparator. For high current amplification, a very high W/L ratio is conventionally chosen.

In accordance with another further feature of the invention, the current impression device and the further current impression device are current sources.

In accordance with a concomitant feature of the invention, there is at least one of a sawtooth generator and an oscillator connected downstream of at least one of the comparator circuit and the further comparator.

The comparator circuit is advantageously used as a trigger circuit for a sawtooth generator disposed downstream of the comparator circuit. The comparator circuit has the advantage that in the normal operating mode, i.e. during the leading or trailing edge of the sawtooth signal, the comparator circuit furnishes a relatively low standby current on its output side.

Near the switchover point of the sawtooth signal, a much higher bias current is added to the standby current. The addition of the bias current is accomplished by the current measuring device, after a comparison of the input signals that result from the sawtooth signal and a reference potential. Near the switching point, the input signals are typically the same. When this condition is detected by the current measuring device, the bias current source is added.

Since this bias current source furnishes a current pulse only at the switchover point of the sawtooth signal, while the clocking edge of the sawtooth signal conversely remains off, the current consumption of the comparator circuit can be considerably minimized.

Advantageously, the comparator circuit is preceded by a further comparator. The upstream comparator circuit then serves as a sense comparator for the downstream comparator. The downstream comparator can typically be the comparator of a sawtooth generator or oscillator.

It proves to be advantageous if the gain of the sense comparator can be jointly utilized. Such an arrangement is then called a two-stage comparator circuit.

Advantageously, the input transistors of the differential amplifiers are field-effect-controlled. This means that the demand for high impedance, which is made in SMT, can be met.

The controllable current source for bias current impression is typically a semiconductor component. Such a component may for instance be a power MOSFET, which is controlled via its gate and via whose drain-to-source load path the bias current is supplied to the downstream comparator. For high current amplification, a very high W/L ratio is conventionally chosen.

Other features which are considered as characteristic for the invention are set forth in the appended claims.

Although the invention is illustrated and described herein as embodied in a comparator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
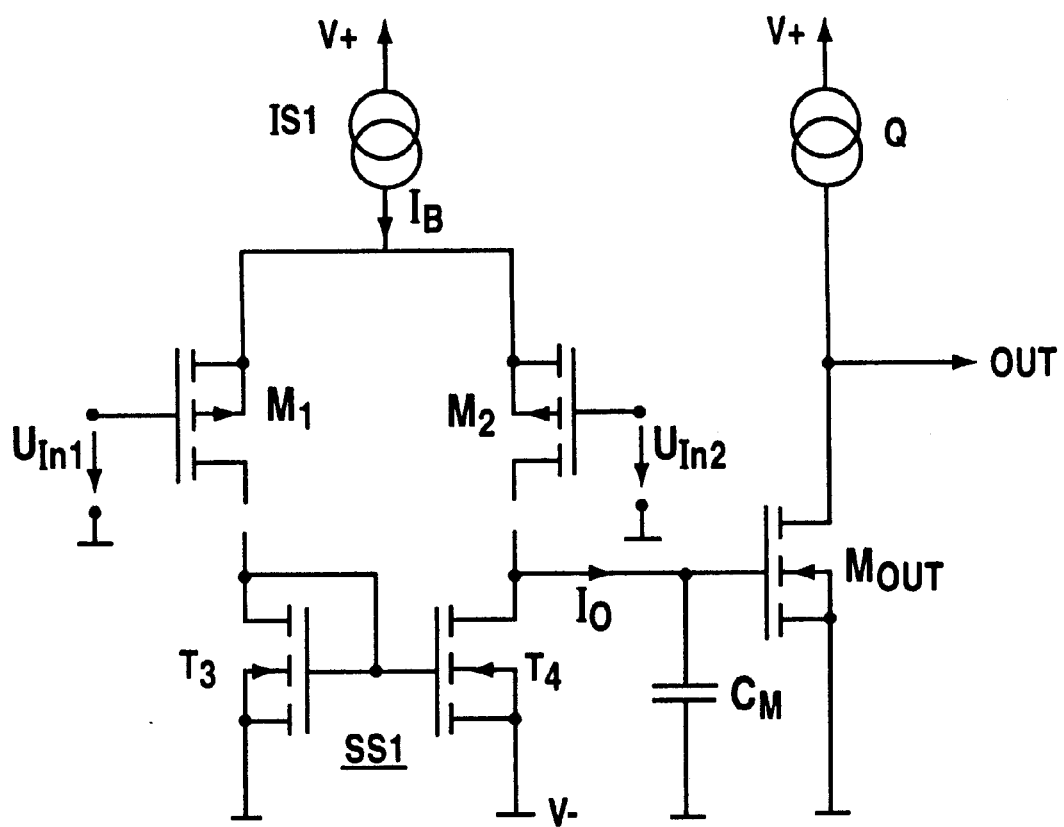
FIG. 1 is a circuit diagram of a prior art MOS comparator circuit.

Referring now to the figures of the drawing in detail and first, particularly, to FIG. 1, there is shown a prior art MOS-type embodiment of a bipolar comparator circuit known from European Patent 0 442 001 B1.

A basic cell of a comparator shown in FIG. 1, essentially includes a differential amplifier which on an output side triggers a transistor. The differential amplifier includes two source-coupled p-channel input transistors M1, M2. The input transistors M1, M2 are embodied as MOSFETs. At their gate terminals, respective input signals UIn1, UIn2 are provided, in the form of voltages provided between the gate terminals and a negative reference potential V−.

The differential amplifier also includes a current mirror, whose base point is also connected to the negative pole V− of the supply voltage source and whose input and output are connected to drain terminals of the two MOSFETs M1, M2, respectively. The current mirror is embodied here by n-channel MOSFETs T3, T4. A current source IS1 is provided between a positive pole V+ of a supply voltage source and the coupled source terminals of the MOSFETs M1, M2.

On the output side, the differential amplifier triggers the gate terminal of a p-channel MOSFET $M_{OUT}$. A drain-to-source load path of the MOSFET $M_{OUT}$ is connected between the negative pole V− and the positive pole V+ of the supply voltage source. A second current source Q is connected between a drain terminal of the MOSFET $M_{OUT}$ and the positive pole V+ of the supply voltage source. An output signal OUT of the comparator circuit is also tapped at the drain terminal of the MOSFET $M_{OUT}$.

With other parasitic capacitances being ignored, only a dominant Miller capacitor $C_M$ of an output stage is shown. The Miller capacitor $C_M$ is connected parallel to a gate-to-source path of the MOSFET $M_{OUT}$.

A charging current of the Miller capacitor $C_M$ then becomes $$I_0 = \beta U_D \sqrt{\frac{I_B}{\beta} - \frac{U_D^2}{4}} \quad (1)$$

Where $\beta$ is a current amplification factor; $I_B$ is a bias current; and $U_D$=UIn1−UIn2 is a difference between the input voltages. In a linear operating range, a change in gate-to-source voltage per unit of time then becomes $$\frac{dU_{GS}}{dt} = \frac{\beta U_D}{C_M} \sqrt{\frac{I_B}{\beta} - \frac{U_D^2}{4}} \quad (2)$$

It can be seen from equation (2) that for short delay times of the comparator or for a great change in gate-to-source voltage per unit of time at the MOSFET $M_{OUT}$, with a given Miller capacitor $C_M$ and low differential voltages $U_D$ at the input (a shallow rising slope of the sawtooth signal), a high current amplification factor $\beta$ and a simultaneously high bias current $I_B$ is necessary.

At the same time, $\beta$~W/L is directly proportional to a ratio of a channel width to a channel length and thus is proportional to the previously ignored parasitic capacitances of the input transistors of the differential amplifier stage. As a result, it makes sense only conditionally to increase the amplification factors of the MOSFETs M1, M2. To shorten the delay times, it is accordingly necessary to increase the current, in which case the change in gate-to-source voltage per unit of time, as an output variable in accordance with equation (2), increases only in proportion to a square root of the bias current IB.

Figure 2:
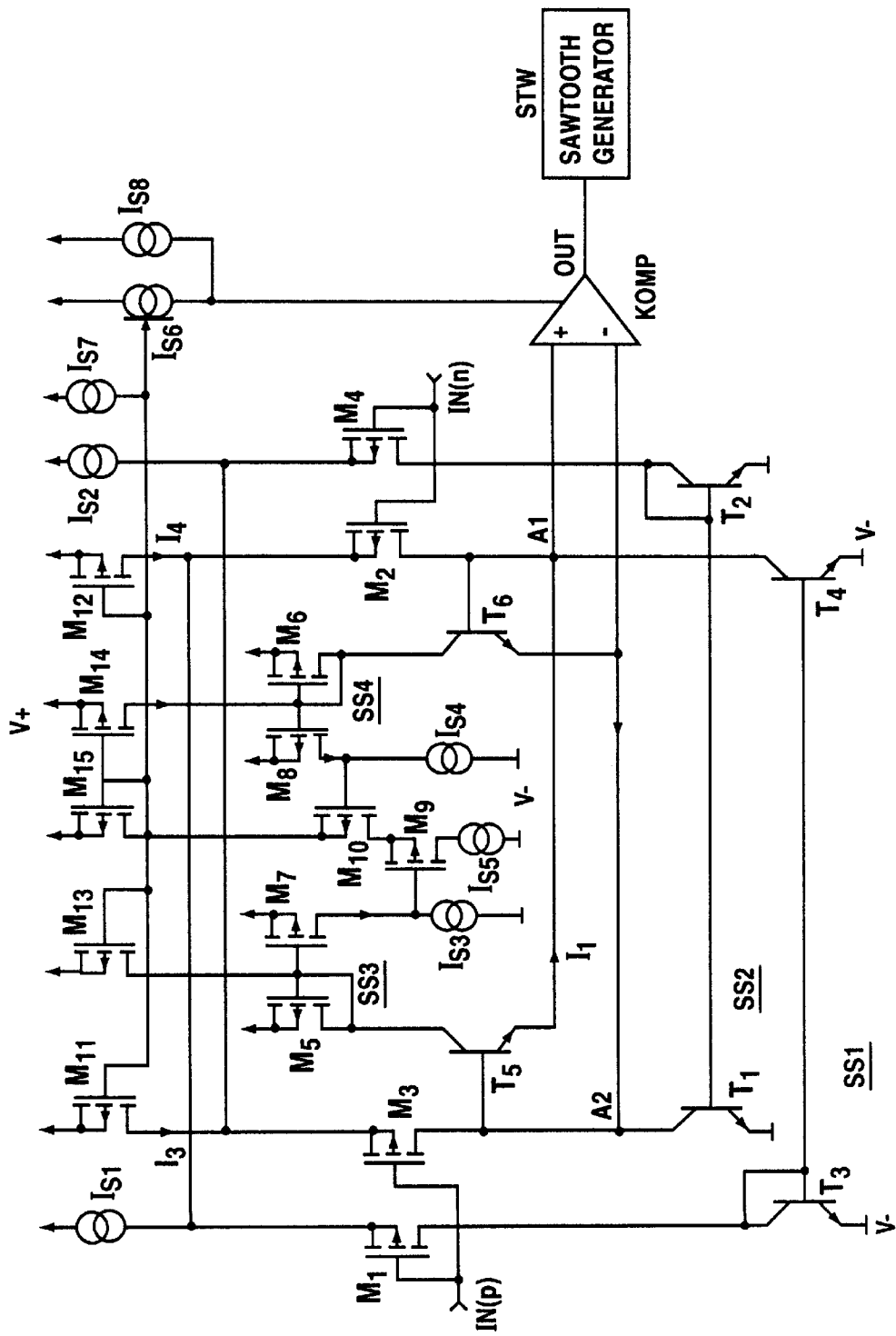
FIG. 2 is a circuit diagram of a generalized embodiment of a MOS comparator circuit according to the invention.

According to the present invention, FIG. 2 shows the comparator circuit having two differential amplifiers, which are connected inversely parallel to one another. A first differential amplifier includes the input transistors M1, M2 and transistors T3, T4. The transistors T3, T4 are connected to one another and form a current mirror circuit SS1. Correspondingly, a second differential amplifier includes input transistors M3, M4 and current mirror transistors T1, T2 of a current mirror SS2.

The two differential amplifiers are connected between the positive pole V+ and the negative pole V− of the supply voltage source. At a first input of each differential amplifier, a first input signal IN(p) is present at the gate terminals of the transistors M1 and M3.

At a second input of each differential amplifier, a second input signal IN(n) is present at gate terminals of the transistors M2 and M4. Current impression devices IS1 and IS2 are connected between coupled source terminals of the transistors M1, M2 and M3, M4, respectively, and the positive pole V+ of the supply voltage source.

The current impression devices IS1, IS2 can be embodied as current sources. The current sources IS1, IS2 furnish a relatively slight current, which is for instance equivalent to a standby current.

To meet the demand for high impedances in SMT comparator circuits, the input transistors M1–M4 are field-effect-controlled transistors. These are p-channel MOSFETs. However, the transistors M1–M4 may also be embodied in bipolar fashion. Then, however, there should be provided provisions for high-impedance triggering of the input transistors, for instance by the use of an MOS level converter or the like.

The current mirror transistors T1–T4 have been embodied as bipolar transistors, in the present example. However, it is also conceivable for the transistors T1–T4 of FIG. 2 to be replaced with field-effect-controlled transistors. Another option in embodying the current mirror circuits is to connect resistors into the load path of the input transistors.

On the output side, via the outputs A1 and A2, the comparator circuit triggers positive and negative inputs, respectively, of a further comparator KOMP disposed downstream of the comparator circuit.

The output A1 is connected to the output of the first differential amplifier, and the output A2 is connected to the output of the second differential amplifier. A respective switching transistor T5 and T6 is connected between the outputs A1 and A2 of each of the differential amplifiers. The switching transistors T5 and T6 are embodied in the present example by bipolar transistors, but they may also be embodied as field-effect-controlled semiconductor components.

The base-to-emitter path of the transistor T5 connects the output of the second differential amplifier to the output of the first differential amplifier, and the base-to-emitter path of the transistor T6 connects the output of the first differential amplifier to the output of the second differential amplifier.

The transistors T5 and T6 are connected on the collector side to the input of a third and fourth current mirror SS3, SS4, respectively. The third current mirror SS3 includes the transistors M5 and M7. The fourth current mirror SS4 includes the transistors M6 and M8. The transistors M5–M8 are p-channel MOSFETs, in the present example.

On the source side, the transistors M5–M8 are connected to the positive pole V+ of the supply voltage source. Reference current sources IS3 and IS4 are connected to the outputs of the third and fourth current mirrors SS3, SS4, respectively, between drain terminals of the transistors M7 and M8, respectively, and the negative pole V− of the supply voltage source.

In addition, outputs of the third and fourth current mirrors SS3, SS4 are coupled to one another via an AND gate. The AND gate has two p-channel MOSFETs M9, M10, whose gate terminals are triggered by the outputs of the current mirrors SS3 and SS4, respectively, and whose drain-to-source load paths are connected in series. The AND gate is disposed between the positive pole V+ and the negative pole V− of the supply voltage source.

The transistor T5, the current mirror SS3, and the reference current source IS3 form a first current measuring device for the first differential amplifier. Correspondingly, the transistor T6, the current mirror SS4, and the reference current source IS4 form a second current measuring device for the second differential amplifier.

A further configuration for current impression IS5 is connected between the AND gate circuitry M9, M10 and the negative pole V− of the supply voltage source. The drain-to-source load path of a mirror transistor M15 is connected between the AND gate circuitry M9, M10 and the positive pole V+ of the supply voltage source.

Drain-to-source load paths of the transistors M12 and M11, respectively, are connected between the first and second differential amplifier, respectively and the positive pole V+ of the supply voltage source. On the gate side, the transistors M11, M12 and M15 are triggered by a current source IS7, which is connected on its other end to the positive pole V+ of the supply voltage source. The transistors M11 or M12, on the one hand, and M15 on the other are connected to one another in a current mirror circuit.

The further configuration for current impression IS5 may be embodied as a current source, for example. The current source IS5 in the present example is much larger in size than the standby current sources IS1 and IS2. The current source IS5 and the transistors M11, M12, M15 connected in the current mirror circuit serve to impress the bias current for the first and second differential amplifiers. The bias current can be added or turned off via the AND gate circuitry M9, M10.

Drain-to-source load paths of respective transistors M13 and M14 are connected between the base point of the third current mirror SS3 and the fourth current mirror SS4, respectively, and the positive pole V+ of the supply voltage source. On the gate side, the transistors M13 and M14 are likewise triggered by the current source IS7 and are thus likewise interconnected to the transistor M15 in a current mirror circuit. The transistors M5–M15 in the present example are embodied as p-channel MOSFETs, but may also be embodied as bipolar transistors.

An output of the AND gate circuitry M9, M10 additionally triggers a controllable current source IS6. This controllable current source IS6 is connected on one side to the positive pole V+ of the supply voltage source, and at its output it triggers the further comparator KOMP. The controllable current source IS6 furnishes a bias current for the further comparator KOMP. The controllable bias current source is advantageously embodied by a MOSFET with a very high W/L ratio.

A further current source IS8 is connected parallel to the controllable bias current source IS6. The current source IS8 is much smaller in size than the controllable current source IS6. Typically, the current source IS8 furnishes a standby current on the order of magnitude of about 50 µA, and the controllable bias current source furnishes a current of about 1 mA.

The positive pole V+ of the supply voltage source is typically at the potential of 7V, and the negative pole V− of the supply voltage source is typically at the potential of the reference ground.

The comparator circuit of FIG. 2, which has two anti-parallel connected differential amplifiers and which has current measuring devices and circuitry for adding a bias current that are disposed between the differential amplifiers, can be used for example as a sense comparator. The sense comparator precedes the actual comparator KOMP. The downstream comparator, in its normal state, is turned off by the sense comparator.

The sense comparator typically measures a sawtooth voltage. Near a switching point of a sawtooth signal, the sense comparator generates a bias current pulse, which is much higher than the standby current. The bias current is delivered to the actual comparator, which is disposed downstream. By way of example, the comparator is the comparator of an oscillator OSC or a sawtooth generator STW.

FIG. 2 shows a two-stage comparator circuit. In the two-stage comparator circuit, the gain of the sense comparator located upstream of the actual comparator can be jointly utilized.

The precise mode of operation of the two-stage comparator circuit shown in FIG. 2 will now be described in further detail.

Far away from the switching point, for instance at a delta voltage, the actual comparator KOMP of FIG. 2 is supplied with only low "standby currents" from the current source IS8. The current source IS7 furnishes a relatively weak current. As a result, the transistors M11–M15, which are connected on the gate side to the current source IS7, are off (nonconducting). The bias current source IS6 is thus off as well.

If the potential of the first input signal IN(p) is much lower than the potential of the second input signal IN(n), the transistors M1 and M3 are opened while M2 and M4 are blocked. Since the drain potential of the transistor M3 is high, the bipolar transistor T5 is conducting. Its emitter current I1 flows out into the collector of T4. The current assumes a value of the current of IS1, since the latter is mirrored by T3 to T4. On the collector side of the transistor T5, the current of IS1 is compared with the current of the current source IS3, via the current mirror SS3. Since the current source IS3 and the current mirror M5, M7 are dimensioned such that the relationship IS1=I2>IS3=IS1:2 is true for this state, the transistor M9 of the AND gate circuitry is OFF.

The current via the transistor T6, conversely, is 0, since its emitter potential is greater than its base potential. Consequently the gate potential of the transistor M10 drops, thus turning this transistor on. Because the transistor M9 of the AND gate circuitry is still OFF, the AND gate formed of the transistors M9 and M10 cannot be switched through by the current source IS5.

As a result, the current source IS7 makes the current bank, including the transistors M11 and M12, as well as the current source IS6, inoperative. The transistors M12 and M13 that are responsible for a circuit hysteresis are likewise OFF.

If the potentials of the input signals IN(p), IN(n) approach one another, the transistor M2 takes on more and more current components from the current source IS1. The current mirrored by the transistor T3 to the transistor T4 drops, and as a result the emitter current I1 of the transistor T5 becomes less as well. As soon as the current I1 is equal to the current I2, or I1=I2≦IS3=IS/2, the transistor M9 is also opened. The transistor M10 is already open. The drain current of the transistor M15 is now determined by the current source IS5 and IS7, respectively, and is multiplied both via the transistor M11 and M12 and via the controllable current source. The increased bias currents I3 and I4 of the transistors M11 and M12 amount to approximately 10 times the base currents, in a concrete realization. These bias currents I3 and I4 are carried via the outputs A1 and A2 of the comparator circuit to the positive and negative inputs, respectively, of the downstream comparator KOMP.

The transistors M13 and M14 avert an unpleasant side effect. For instance, if the bias current I4 is imposed by the opening of the transistor M9, then the value of the current I1 rises suddenly as well, since the transistor T4, via the transistor t3 of the current mirror SS1, can draw a higher current. Without the transistor M13, the current I2 would rise again and the transistor M9 would be undesirably turned off. To prevent this "transient response", the sudden rise in the current I2 can be prevented by the transistor M13. If the drain current of M13 is chosen to be greater than the sudden change in the current I1, then the switchover undergoes stabilization due to hysteresis.

At the switching point, if the potentials of the input signals IN(p) and IN(n) of the differential amplifier stages are equal, the actual comparator KOMP is then supplied with a substantially increased bias current. As a result, both the transistor T5 and the transistor T6 are blocked. The comparator is unimpaired in its function.

After the switching point, if a potential of the first input signal IN(p) is greater than a potential of the second input signal IN(n), the transistor T5 is closed. The transistor T6 opens, as soon as its base-to-emitter threshold voltage is reached. Since the mirror ratio of each current mirror SS1 and SS2 equals 1, the transistor M10 closes precisely whenever the demand I5−I6=I7≧IS2/2 is met. The bias currents I3, I4 and the current source IS6 are turned off. The comparator KOMP is once again in the standby mode.

The transistors T5 and T6 additionally have the task of preventing a saturation of the transistors T4 and T1. Thus if a collector potential of the transistor T4 rises, the collector potential of transistor T1 follows along with the rise and thus forms a base-emitter diode.

In principle it would also be possible to embody the AND gate formed of the transistors M9 and M10 by connecting the collectors of the transistors T5 and T6. In that case, the transistors M6, M8, M10 and M14 and the current source IS4 could be dispensed with.

The circuit of FIG. 2 has the following advantage: the addition of the bias current must not proceed too slowly, so that the full bias current will be reached before reaching the switching point. Depending on the steepness of the leading or trailing edge of the sawtooth signal, the demanded speed of the addition can vary, and this speed can be increased only by increasing the applicable base current. Steep edges require a higher base current, but that current flows only for a shorter time, which depends on the duty cycle. The standby currents of the current sources IS1 and IS2 can thus be chosen independently of one another and in accordance with an increase of the input signal, so as to minimize the total current consumption.

FIG. 2 shows a two-stage comparator in a "standby circuit" that adds the bias current pulse only during the switching point, for instance in the case of a delta voltage.

As a result, the total current consumption of the comparator circuit can be minimized considerably. Nevertheless, high switching speeds are assured, even with shallow voltage edges over time, despite the use of p-channel MOSFETs.

At the instance of current imposition, the gate-to-source capacitances of the input transistors M1–M4 are charged, and as a result, especially in the case of high amplification factors β, a transient current pulse can reach an internal voltage specification. It is therefore sometimes necessary to provide capacitive reinforcement for the input transistors M1–M4. Otherwise, a brief change in the voltage specification could lead to a premature switchover of the comparator, which must absolutely be precluded under all circumstances.

Figure 3:
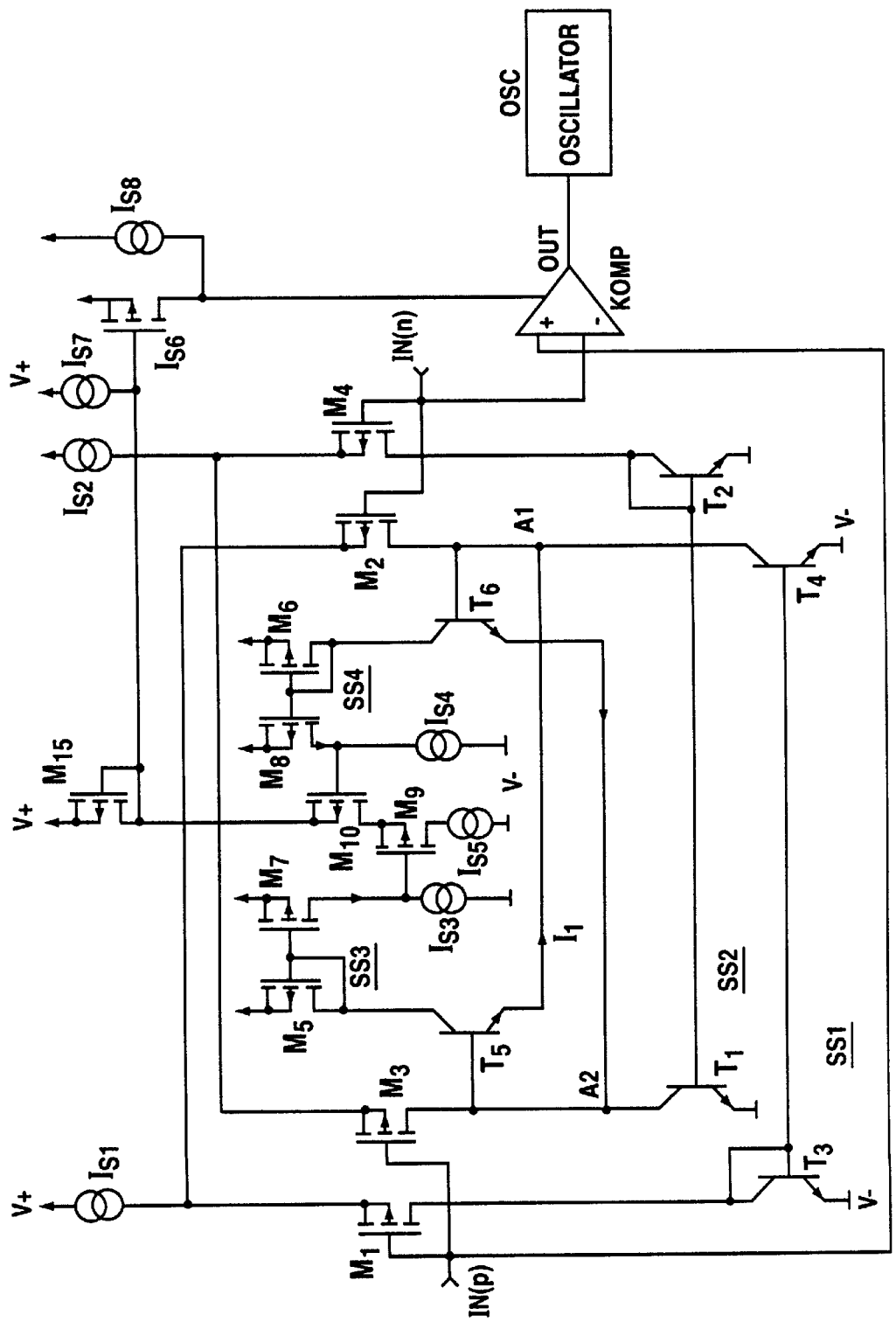
FIG. 3 is a circuit diagram of a preferred embodiment of the MOS comparator circuit.

FIG. 3 shows a further preferred embodiment of the comparator circuit of the invention. The comparator circuit of FIG. 3 has substantially the same elements as the comparator circuit of FIG. 2.

In contrast to FIG. 2, in the sense comparator the two inputs IN(p) and IN(n) are connected directly to the positive and negative inputs, respectively, of the actual comparator KOMP, which is located downstream of the sense comparator. The outputs A1 and A2 are thus no longer connected to the actual comparator. In the embodiment of the sense comparator circuit of FIG. 3, the transistors M11–M14 of the current mirror circuit are thus omitted as well. Hence only transistor M15 triggers the controllable current source IS6. The controllable current source IS6 has been shown in FIG. 3 as a MOSFET.

The circuit of FIG. 3 is known as a single-stage comparator circuit. The gain of the sense comparator is not jointly utilized. The circuit does have the advantage over FIG. 2, however, that the aforementioned unpleasant side effects, i.e. "transient response" of the comparator circuit is eliminated.

I claim:

1. A circuit, comprising:
   one differential amplifier receiving a plurality of input signals and having an output;
   at least one further differential amplifier receiving the same plurality of input signals and having a further output;
   a first current measuring configuration connected to said one differential amplifier;
   a second current measuring configuration connected to said at least one further differential amplifier;
   a comparator circuit;
   a controllable bias current source connected to said comparator circuit located downstream of said controllable bias current source; and
   an amplifier stage connected to said controllable bias current source and activated by said first current measuring configuration and said second current measuring configuration if said plurality of input signals are approximately identical, said amplifier stage, when activated, switching on said controllable bias current source for supplying current to said comparator circuit.

2. The circuit according to claim 1, wherein the plurality of input signals include a first input signal and a second input signal; and
   at least one of said one differential amplifier and said one further differential amplifier includes:
      a first input transistor with a drain terminal, a source terminal and a gate terminal, said gate terminal of said first input transistor receiving the first input signal;
      a second input transistor with a drain terminal, a source terminal and a gate terminal, said gate terminal of said second input transistor receiving the second input signal;
      a current mirror circuit connected to a first pole of a supply voltage,
      said drain terminal of said first input transistor and said drain terminal of said second input transistor connected to said current mirror circuit, said source terminal of said first input transistor coupled to said source terminal of said second input transistor; and
      a current impression device connected to said coupled source terminals of said first input transistor and said second input transistor and to the second pole of the supply voltage.

3. The circuit according claim 1, wherein said at least one further differential amplifier is interconnected equivalently to said one differential amplifier and is connected inversely parallel to said one differential amplifier.

4. The circuit according to claim 1, wherein said first and second current measuring configurations include:
   first and second current mirror circuits each having an output side;
   first and second switching transistors coupling said first current mirror circuit to said at least one further differential amplifier and said second current mirror circuit to said one differential amplifier; and
   first and second reference current sources, said first and said second current mirror circuits each being connected on said output side to said first and said second reference current sources, respectively.

5. The circuit according to claim 4, wherein said amplifier stage includes an AND gate circuit, and said first and said second current mirror circuits are coupled to one another on said output side by said AND gate circuit.

6. The circuit according to claim 2, including a further current impression device for current impression, said amplifier stage including an AND gate circuit connected to said further current impression device, said further current impression device forming a second amplifier stage.

7. The circuit according to claim 2, wherein said first input transistor and said second input transistor are p-channel MOSFETs.

8. The circuit according to claim 1, wherein said controllable bias current source is a controllable semiconductor element.

9. The circuit according to claim 2, wherein said current impression device is a current source.

10. The circuit according to claim 6, wherein said further current impression device is a current source.

11. The circuit according to claim 1, including at least one of a sawtooth generator and an oscillator connected downstream of at least one of the circuit and said comparator circuit.

* * * * *